United States Patent
Jang et al.

(10) Patent No.: US 8,351,207 B2
(45) Date of Patent: Jan. 8, 2013

(54) HEAT PIPE CAPABLE OF TRANSFORMING DYNAMIC ENERGY INTO ELECTRIC ENERGY AND RELATED HEAT-DISSIPATING MODULE

(75) Inventors: Yung-Li Jang, Taipei Hsien (TW); Chia-Feng Huang, Taipei Hsien (TW); Ming-Chi Kao, Taipei Hsien (TW); Ming-Chih Chen, Taipei Hsien (TW)

(73) Assignee: Wistron Corporation, Xizhi Dist., New Taipei (TW)

( * ) Notice: Subject to any disclaimer, the term of this patent is extended or adjusted under 35 U.S.C. 154(b) by 182 days.

(21) Appl. No.: 13/014,693

(22) Filed: Jan. 26, 2011

(65) Prior Publication Data

US 2011/0235277 A1    Sep. 29, 2011

(30) Foreign Application Priority Data

Mar. 25, 2010   (TW) ................................ 99108876 A

(51) Int. Cl.
*H05K 7/20*   (2006.01)
*F28D 15/04*   (2006.01)

(52) U.S. Cl. .............. 361/700; 361/679.46; 361/679.52; 361/701; 165/80.5; 165/104.21; 165/104.26; 165/104.33; 310/311; 310/339

(58) Field of Classification Search ............. 361/679.46, 361/679.47, 679.52, 679.55, 688, 689, 700–701; 165/80.2, 80.3, 80.4, 80.5, 104.26, 104.33, 165/104.34, 185; 257/713–718; 174/15.1, 174/16.3, 252; 62/3.2, 3.3, 3.7, 259.2; 310/311, 310/339

See application file for complete search history.

(56) References Cited

U.S. PATENT DOCUMENTS

| 7,411,337 | B2 * | 8/2008 | Tadayon et al. | 310/339 |
| 2009/0034202 | A1 * | 2/2009 | Chiu et al. | 361/704 |
| 2011/0079372 | A1 * | 4/2011 | Moon et al. | 165/104.26 |
| 2011/0095648 | A1 * | 4/2011 | Zhang | 310/311 |

FOREIGN PATENT DOCUMENTS

JP   02009290960 A   * 12/2009

* cited by examiner

*Primary Examiner* — Michail V Datskovskiy
(74) *Attorney, Agent, or Firm* — Winston Hsu; Scott Margo

(57) ABSTRACT

A heat pipe includes a conductive hollow case, a conductive capillary layer, a piezoelectric component, and a flexible component. The conductive hollow case has a first end and a second end. The first end is connected to a heat-generating component. The second end is a heat-dissipating end. The conductive capillary layer is formed on an inner wall of the conductive hollow case. A liquid stored in the conductive capillary layer can be heated to evaporate by the heat-generating component and then move toward the second end. The piezoelectric component is connected to the conductive capillary layer. The flexible component is disposed at a side of the piezoelectric component for being driven by the evaporated liquid so as to exert force upon the piezoelectric component. Thus, the piezoelectric component can generate electric energy, which can be transmitted from the conductive capillary layer to the conductive hollow case.

15 Claims, 4 Drawing Sheets

HEAT PIPE CAPABLE OF TRANSFORMING DYNAMIC ENERGY INTO ELECTRIC ENERGY AND RELATED HEAT-DISSIPATING MODULE

BACKGROUND OF THE INVENTION

1. Field of the Invention

The invention relates to a heat pipe and a related heat-dissipating module, and more specifically, to a heat pipe capable of transforming dynamic energy into electric energy and a related heat-dissipating module.

2. Description of the Prior Art

With improvement of electronic technology, there are more and more complicated and powerful functions built in electronic products. In other words, an operational speed of a micro processing unit (such as a CPU chip, a VGA chip) built in an electronic product needs to become faster and faster so as to handle a huge amount of system work. However, heat also increases considerably with the high operational speed of the micro processing unit. If the said heat is not dissipated properly, it may crash or damage the components in the electronic product due to overheating. Therefore, many auxiliary devices for dissipating heat generated by micro processing units built in an electronic product are manufactured accordingly. A heat pipe is a representative example in recent years.

Heat-dissipating efficiency of a heat pipe is extremely high. For example, in the same temperature difference, heat-dissipating efficiency of a heat pipe is at least 1000 times that of a metal rod. Thus, how to utilize a heat pipe efficiently for waste heat reduction and power recycling should be a concern in its heat-dissipating design.

SUMMARY OF THE INVENTION

An embodiment of the invention provides a heat pipe capable of transforming dynamic energy into electric energy. The heat pipe includes a conductive hollow case having a first end and a second end, a conductive capillary layer, a piezoelectric component, and a flexible component. The first end is connected to a heat-generating component. The second end is a heat-dissipating end. The conductive capillary layer is formed on an inner wall of the conductive hollow case. A liquid is stored in the conductive capillary layer. The liquid is capable of being heated to evaporate by the heat generating component and then moving toward the second end. The piezoelectric component is connected to the conductive capillary layer. The flexible component is disposed at a side of the piezoelectric component for being driven by the evaporated liquid so as to exert force upon the piezoelectric component. Electric energy generated by the piezoelectric component can be transmitted from the conductive capillary layer to the conductive hollow case, and the conductive hollow case is used for conducting heat energy to the liquid and dissipating the heat energy absorbed by the liquid from the second end.

An embodiment of the invention further provides a heat-dissipating module capable of transforming dynamic energy into electric energy. The heat-dissipating module includes a heat-generating component, a heat pipe, and an energy storage device. The heat pipe is disposed between the heat-generating component and a heat-dissipating device. The heat pipe includes a conductive hollow case having a first end and a second end, a conductive capillary layer, a piezoelectric component, and a flexible component. The first end is connected to the heat-generating component. The second end is a heat-dissipating end and is connected to the heat-dissipating device. The conductive capillary layer is formed on an inner wall of the conductive hollow case. A liquid is stored in the conductive capillary layer. The liquid is capable of being heated to evaporate by the heat-generating component and then moving toward the second end. The piezoelectric component is connected to the conductive capillary layer. The flexible component is disposed at a side of the piezoelectric component for being driven by the evaporated liquid so as to exert force upon the piezoelectric component. The energy storage device is electrically connected to the heat pipe for storing electric energy generated by the piezoelectric component. The electric energy generated by the piezoelectric component can be transmitted from the conductive capillary layer to the conductive hollow case, and the conductive hollow case is used for conducting heat energy to the liquid and dissipating the heat energy absorbed by the liquid from the second end.

These and other objectives of the invention will no doubt become obvious to those of ordinary skill in the art after reading the following detailed description of the preferred embodiment that is illustrated in the various figures and drawings.

DETAILED DESCRIPTION

Figure 1:
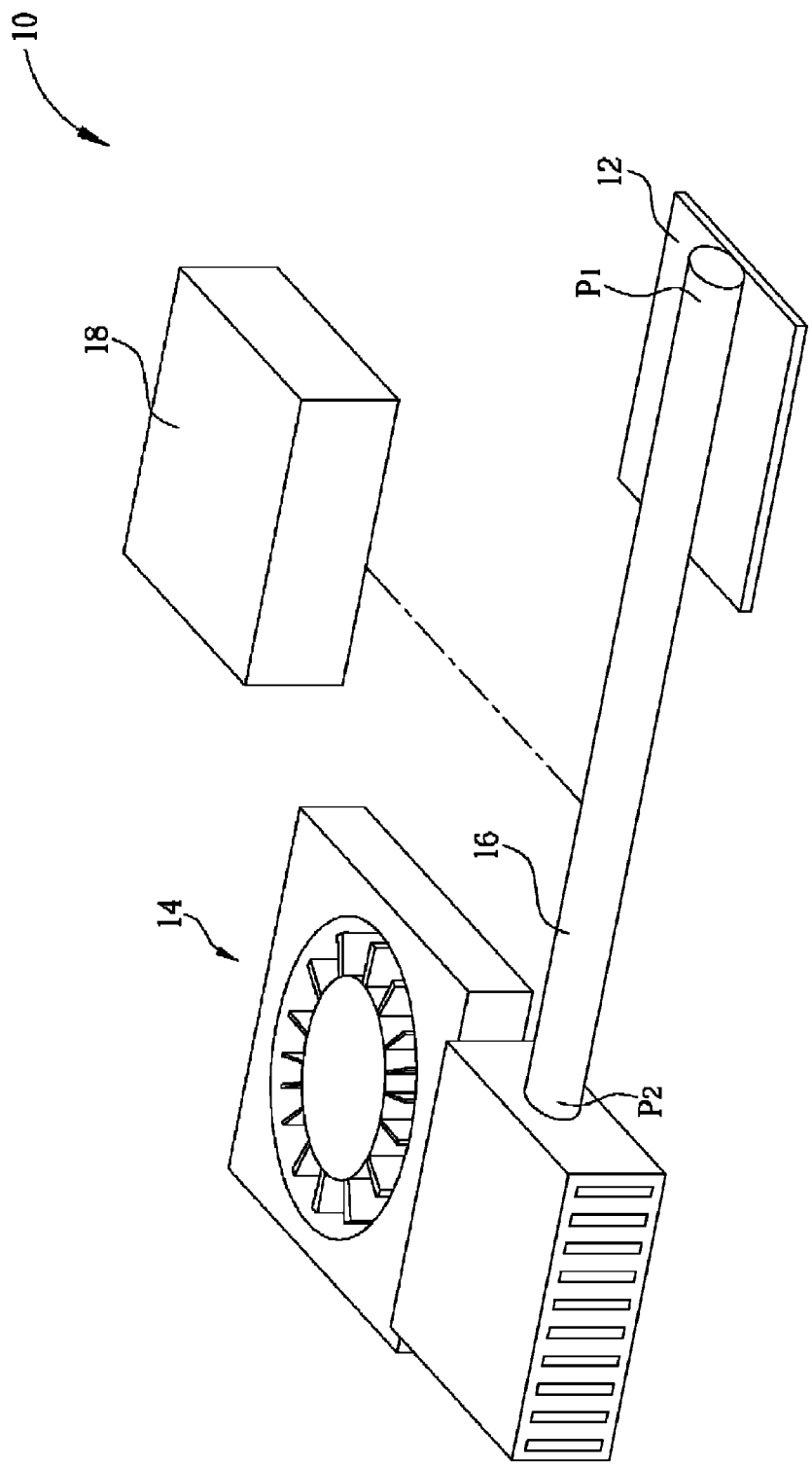
FIG. 1 is a diagram of a heat-dissipating module according to a preferred embodiment of the invention.

Please refer to FIG. 1, which is a diagram of a heat-dissipating module 10 according to a preferred embodiment of the invention. The heat-dissipating module 10 includes a heat-generating component 12, a heat-dissipating device 14, a heat pipe 16, and an energy storage device 18. The heat-dissipating module 10 is preferably applied to a conventional electronic device (e.g. a computer) for heat dissipating. The heat-generating component 12 may be a component installed inside the electronic device, which is capable of generating heat during working, such as a center processing unit (CPU), a video graphics array (VGA) chip, etc. The heat-dissipating device 14 is used for dissipating heat energy generated by the heat-generating component 12. In this embodiment, the heat-dissipating device 14 is preferably an assembly of a heat-dissipating fin and a fan (as shown in FIG. 1), but is not limited thereto.

As shown in FIG. 1, the heat pipe 16 is disposed between the heat-generating component 12 and the heat-dissipating device 14. The heat pipe 16 is used for conducting heat energy generated by the heat-generating component 12 to the heat-dissipating device 14 so that the heat energy can be dissipated by the heat-dissipating device 14.

In the following, the heat-dissipating principle of a heat pipe is provided in detail. A method for manufacturing a heat pipe involves adding working liquid into a metal pipe which is long, thin, hollow, and sealed at both ends. The inner wall of the metal pipe has a layer of capillary organization. The working liquid in the capillary organization can evaporate at about 30° C. since the air pressure inside the metal pipe is very low. In such a manner, when an end of the metal pipe is disposed at a heat-generating component as a high temperature end and the other end of the metal pipe is disposed at a heat-dissipating device as a low temperature end, the metal pipe starts to conduct heat energy generated by the heat-generating component. The heat transfer procedure of the metal pipe is described as follows. First, the heat energy generated by the heat-generating component goes through the wall of the metal pipe and then enters the capillary organization. At this time, the working liquid in the capillary organization starts evaporating into vapor due to being heated. Next, the said vapor gathers at the high temperature end and then moves to the low temperature end. When the said vapor arrives at the low temperature end, it condenses into liquid again due to a low temperature at the low temperature end. At this time, the heat energy released during condensation of the said vapor is conducted to the outside of the metal pipe after passing through the capillary organization and the wall of the metal pipe sequentially. Then, the liquid generated during condensation of the said vapor flows through the capillary organization back to the high temperature end due to capillary pumping. Thus, the heat energy conducted from the high temperature end of the metal pipe can be dissipated by repeating the said heat transfer procedure of the metal pipe.

Figure 2:
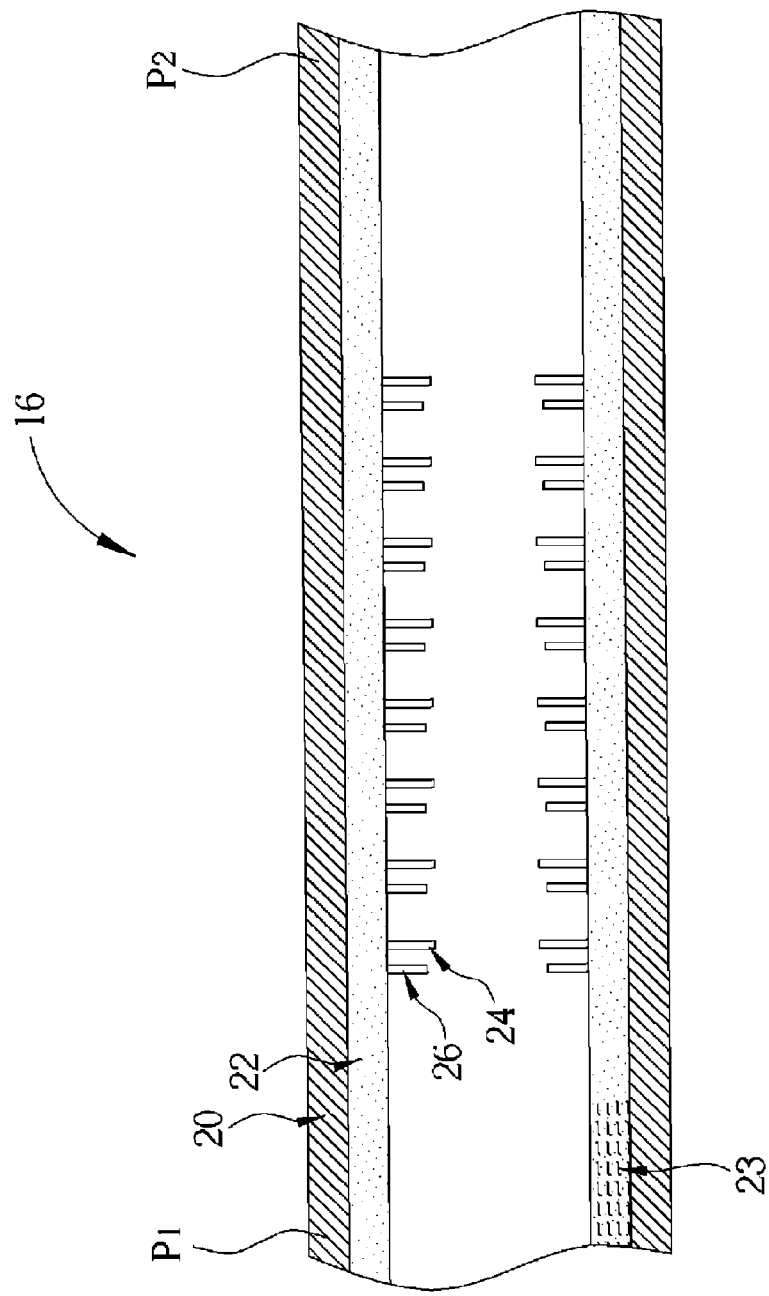
FIG. 2 is a partial interior diagram of a heat pipe in FIG. 1.

Next, please refer to FIG. 2, which is a partial interior diagram of the heat pipe 16 in FIG. 1. As shown in FIG. 2, the heat pipe 16 includes a conductive hollow case 20, a conductive capillary layer 22, at least one piezoelectric component 24 (sixteen shown in FIG. 2, but not limited thereto), and at least one flexible component 26 (sixteen shown in FIG. 2, but not limited thereto). The conductive hollow case 20 has a first end $P_1$ and a second end $P_2$. The first end $P_1$ is connected to the heat-generating component 12, and the second end $P_2$ is connected to the heat-dissipating device 14. The conductive capillary layer 22 is formed on an inner wall of the conductive hollow case 20 (as shown in FIG. 2). A liquid 23 is stored in the conductive capillary layer 22. The liquid 23 can be heated to evaporate by the heat-generating component 12 and then move toward the second end $P_2$. That is, the liquid 23 is used for absorbing heat energy generated by the heat-dissipating component 12 and then moving to the heat-dissipating device 14 so as to dissipate the heat energy. In this embodiment, the conductive hollow case 20 and the conductive capillary layer 22 are preferably made of copper material, and the liquid 23 is preferably pure water.

As shown in FIG. 2, each piezoelectric component 24 is connected to the conductive capillary layer 22 and is preferably made of PZT material which is piezoelectric ceramics with a high piezoelectric constant and a high dielectric constant. When the PZT material receives an external stress, polarization may occur within and then an electric field or electric displacement may be generated accordingly between two conductive surfaces of the PZT material. As a result, the surface of the PZT material starts to produce induced charges so that the PZT material may generate electric energy.

Each flexible component 26 is disposed at a side of the corresponding piezoelectric component 24, respectively. The flexible component 26 is used for being driven to exert force upon the corresponding piezoelectric component 24 by the evaporated liquid 23, so as to make the piezoelectric component 24 generate electric energy. Disposal of the flexible component 26 and the piezoelectric component 24 is as shown in FIG. 2. That is, the piezoelectric component 24 and the flexible component 26 are vertically connected to the conductive capillary layer, respectively, and the piezoelectric component 26 is disposed at a specific distance from the corresponding piezoelectric component 24.

Furthermore, as shown in FIG. 1, the said energy storage device 18 is electrically connected to the heat pipe 16 for storing electric energy generated by the piezoelectric component 24. The energy storage device 18 may be a common device for storing electric energy, such as a capacitance device or a rechargeable battery. As for the method for electrically connecting the energy storage device 18 to the heat pipe 16, the related description is omitted herein since it is commonly seen in the prior art.

Figure 3:
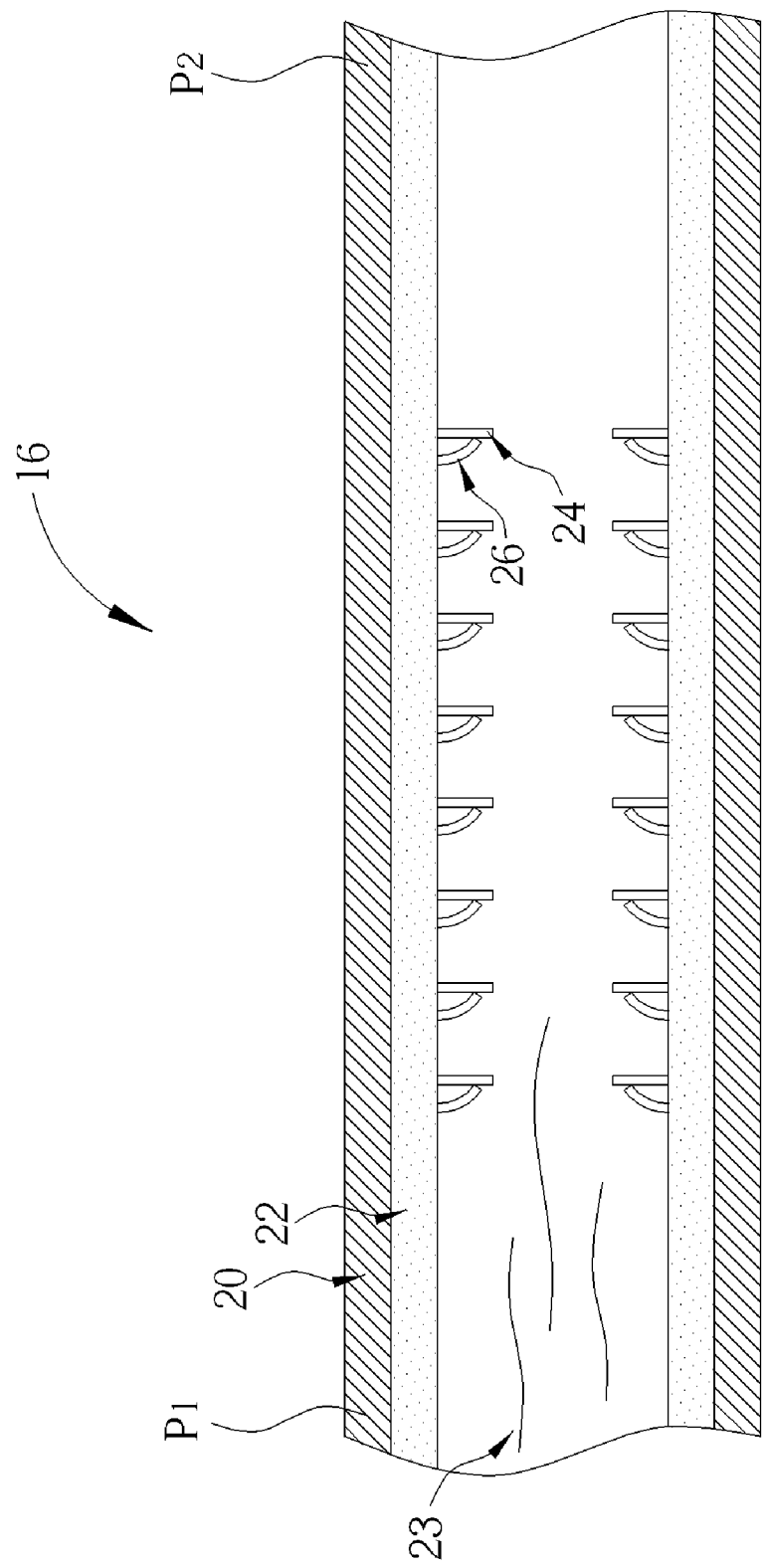
FIG. 3 is a diagram of a flexible component in FIG. 2 exerting force upon a piezoelectric component.

More detailed description for the heat-dissipating module 10 is provided as follows. Please refer to FIG. 1, FIG. 2, and FIG. 3. FIG. 3 is a diagram of the flexible component 26 in FIG. 2 exerting force upon the piezoelectric component 24. When the said heat-generating component 12 starts to produce heat energy during working, the conductive hollow case 20 may conduct the heat energy to the liquid 23 stored in the conductive capillary layer 22. At this time, the liquid 23 in a condensed state may be heated to evaporate after absorbing the heat energy, and then leave the conductive capillary layer 22. When gathering at the first end $P_1$ of the conductive hollow case 20 (as shown in FIG. 3), the evaporated liquid 23 starts to move from the first end $P_1$ of the conductive hollow case 20 (i.e. a high temperature end) to the second end $P_2$ (i.e. a low temperature end). After arriving at the second end $P_2$, the conductive hollow case may conduct the heat energy absorbed by the liquid 23 to heat-generating device 14 for heat dissipating. Simultaneously, the liquid 23 condenses back into the condensed state again due to a low temperature at the second end $P_2$, and then flows through the conductive capillary layer 22 back to the first end $P_1$ due to capillary pumping. Thus, the heat energy generated by the heat-generating component 12 can be dissipated by repeating the said heat transfer procedure.

During the evaporated liquid 23 moves to the second end $P_2$, its dynamic energy may be absorbed by the flexible component 26 when the liquid 23 hits the flexible component 26 so as to cause deformation of the flexible component 26. In other words, when the evaporated liquid 23 goes through the flexible component 26 vertically disposed on the conductive capillary layer 22, the flexible component 26 may be deformed from a structure as shown in FIG. 2 into a structure as shown in FIG. 3, so as to hit the piezoelectric component 24. At this time, the piezoelectric component 24 may receive the stress generated from the flexible component 26, and then produce electric energy correspondingly. Subsequently, the electric energy produced by the piezoelectric component 24 can be transmitted to the energy storage device 18 via electrical connection between the energy storage device 18 and the heat pipe 16 for subsequent power recharge or energy storage. In brief, during the heat pipe 16 conducts the heat energy generated by the heat-generating component 12 to the heat-dissipating device 14 for heat dissipating, the flexible component 26 may be driven by the evaporated liquid 23 and then hit the piezoelectric component 24 continuously, so as to make the piezoelectric component 24 produce electric energy. Finally, the said electric energy produced by the piezoelectric component 24 may be further stored in the energy storage device 18 for power recycling. Furthermore, based on the Principle of Conservation of Energy, heat energy needed to be dissipated by the heat-dissipating device 14 may be correspondingly reduced since the heat energy absorbed by the liquid 23 is partially transformed into electric energy and then is stored in the energy storage device 18. Thus, the heat-dissipating ability of the heat-dissipating device 14 needed for dissipating heat energy generated from the heat-generating component 12 can be decreased. For example, the rotary speed of the fan of the heat-dissipating device 14 may be decreased, or the structural size of the heat-dissipating device 14 may be reduced correspondingly. In such a manner, noise generated by the heat-dissipating device 14 when dissipating heat energy may be lowered greatly.

Figure 4:
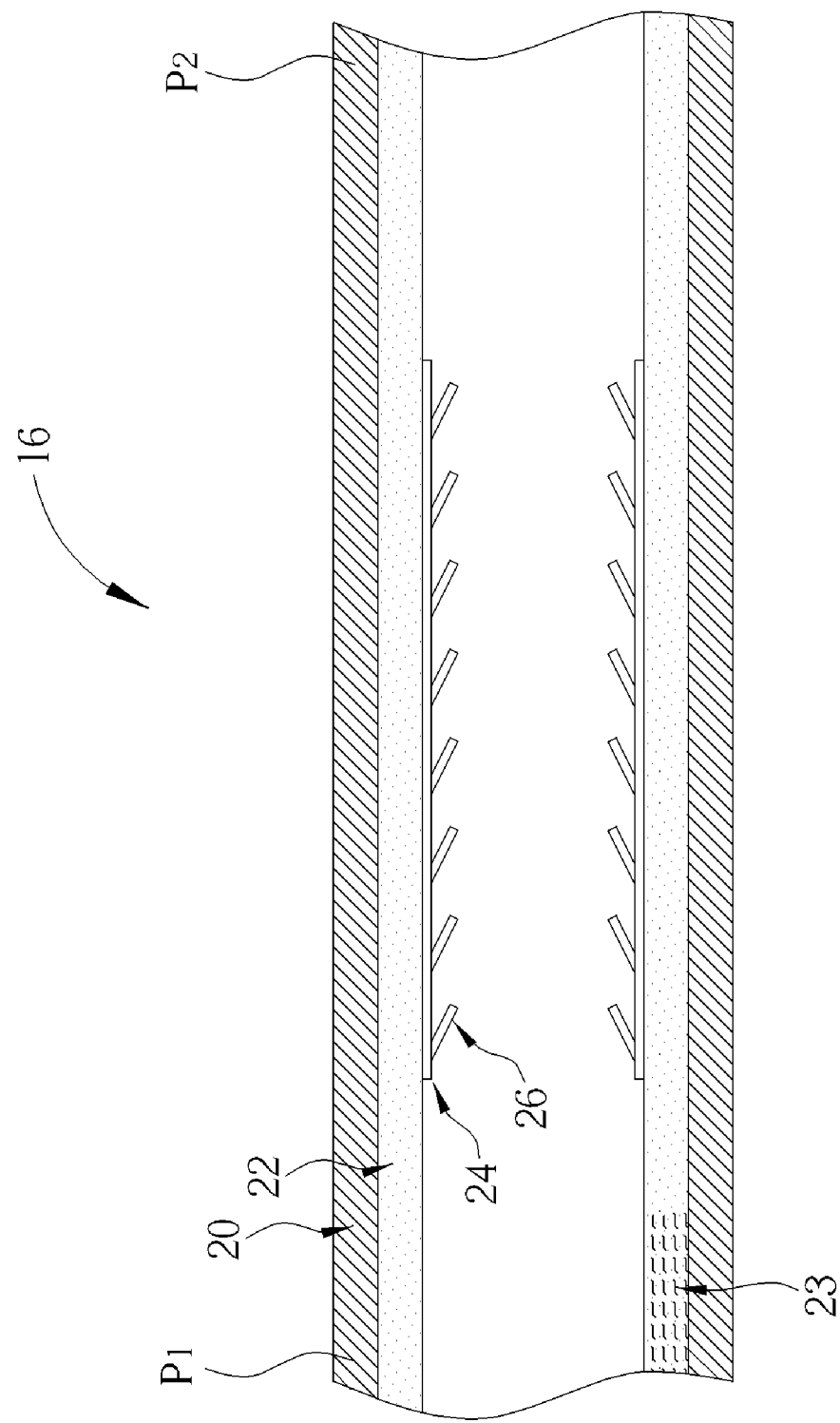
FIG. 4 is an interior diagram of the heat pipe according to another preferred embodiment of the invention.

Disposal of the piezoelectric component 24 and the flexible component 26 is not limited to the said embodiment, and it may vary with the manufacturing needs of the heat pipe 16. For example, the piezoelectric component 24 may be attached to the conductive capillary layer 22 instead, and the flexible component 26 may be connected to the surface of the piezoelectric component 24 at a specific angle correspondingly. The related disposal may be as shown in FIG. 4, which is an interior diagram of the heat pipe 16 according to another preferred embodiment of the invention. As for other disposal designs, they are reasoned by analogy, meaning that all the structural designs may fall within the scope of the invention, which involve utilizing a flexible component to hit a piezoelectric component so as to transform dynamic energy generated by evaporated liquid in a heat pipe into electric energy. Furthermore, in the heat-dissipating module 10, the heat-dissipating device 14 may be an omissible component. That is, the heat pipe 16 may only utilize its high heat-conductive characteristic to dissipate heat energy generated by the heat-generating component 12 at its second end $P_2$ without the heat-dissipating device 14 for simplifying the structural design of the heat-dissipating module 10. As for which disposal is utilized, it may depend on the practical application of the heat-dissipating module 10.

Compared with the prior art utilizing a heat pipe only for heat dissipating, the heat-dissipating module provided by the invention further utilizes dynamic energy of evaporated liquid in the heat pipe as well as assembly of the flexible component and the piezoelectric component which are disposed on the inner wall of the heat pipe. Thus, the dynamic energy can be partially transformed into electric energy generated by the piezoelectric component after receiving an external stress exerted by the flexible component. In such a manner, the invention may not only achieve the purpose of recycling of waste heat energy, but also lower noise generated by the heat-dissipating device when dissipating heat energy and reduce the structural size of the heat-dissipating device needed for heat dissipating.

Those skilled in the art will readily observe that numerous modifications and alterations of the device and method may be made while retaining the teachings of the invention.

What is claimed is:

1. A heat pipe capable of transforming dynamic energy into electric energy, the heat pipe comprising:
   a conductive hollow case having a first end and a second end, the first end being connected to a heat-generating component, the second end being a heat-dissipating end;
   a conductive capillary layer formed on an inner wall of the conductive hollow case, a liquid being stored in the conductive capillary layer, the liquid being capable of being heated to evaporate by the heat-generating component and then moving toward the second end;
   a piezoelectric component connected to the conductive capillary layer; and
   a flexible component disposed at a side of the piezoelectric component, for being driven by the evaporated liquid so as to exert force upon the piezoelectric component by hitting the piezoelectric component;
   wherein electric energy generated by the piezoelectric component is transmitted from the conductive capillary layer to the conductive hollow case, and the conductive hollow case is used for conducting heat energy to the liquid and dissipating the heat energy absorbed by the liquid from the second end.

2. The heat pipe of claim 1, wherein the second end is further connected to a heat-dissipating device for dissipating the heat energy absorbed by the liquid.

3. The heat pipe of claim 1, wherein the piezoelectric component and the flexible component are vertically connected to the conductive capillary layer, respectively, and the piezoelectric component is disposed at a specific distance from the piezoelectric component.

4. The heat pipe of claim 1, wherein the piezoelectric component is attached to the conductive capillary layer, and the flexible component is connected to the piezoelectric component at a specific angle.

5. The heat pipe of claim 1, wherein the conductive hollow case is electrically connected to an energy storage device for transmitting the electric energy generated by the piezoelectric component to the energy storage device.

6. The heat pipe of claim 1, wherein the conductive hollow case and the conductive capillary layer are made of copper material.

7. The heat pipe of claim 1, wherein the piezoelectric component is made of PZT material.

8. The heat pipe of claim 1, wherein the liquid is pure water.

9. A heat-dissipating module capable of transforming dynamic energy into electric energy, the heat-dissipating module comprising:
   a heat-generating component;
   a heat pipe disposed between the heat-generating component and a heat-dissipating device, the heat pipe comprising:
      a conductive hollow case having a first end and a second end, the first end being connected to the heat-generating component, the second end being a heat-dissipating end and being connected to the heat-dissipating device;
      a conductive capillary layer formed on an inner wall of the conductive hollow case, a liquid being stored in the conductive capillary layer, the liquid being capable of being heated to evaporate by the heat-generating component and then moving toward the second end;
      a piezoelectric component connected to the conductive capillary layer; and
      a flexible component disposed at a side of the piezoelectric component, for being driven by the evaporated liquid so as to exert force upon the piezoelectric component by hitting the piezoelectric component; and
   an energy storage device electrically connected to the heat pipe for storing electric energy generated by the piezoelectric component;
   wherein the electric energy generated by the piezoelectric component is transmitted from the conductive capillary layer to the conductive hollow case, and the conductive hollow case is used for conducting heat energy to the liquid and dissipating the heat energy absorbed by the liquid from the second end.

10. The heat-dissipating module of claim 9, wherein the piezoelectric component and the flexible component are vertically connected to the conductive capillary layer, and the piezoelectric component is disposed at a specific distance from the piezoelectric component.

11. The heat-dissipating module of claim 9, wherein the piezoelectric component is attached to the conductive capillary layer, and the flexible component is connected to the piezoelectric component at a specific angle.

12. The heat-dissipating module of claim 9, wherein the energy storage device is a capacitance device or a rechargeable battery.

13. The heat-dissipating module of claim 9, wherein the conductive hollow case and the conductive capillary layer are made of copper material.

14. The heat-dissipating module of claim 9, wherein the piezoelectric component is made of PZT material.

15. The heat-dissipating module of claim 9, wherein the liquid is pure water.

* * * * *